US009873771B2

(12) United States Patent
Nomura et al.

(10) Patent No.: US 9,873,771 B2
(45) Date of Patent: Jan. 23, 2018

(54) FILM-LIKE EPOXY RESIN COMPOSITION, METHOD OF PRODUCING FILM-LIKE EPOXY RESIN COMPOSITION, AND METHOD OF PRODUCING SEMICONDUCTOR DEVICE

(71) Applicant: HITACHI CHEMICAL COMPANY, LTD., Tokyo (JP)

(72) Inventors: Yutaka Nomura, Tokyo (JP); Yusuke Watase, Tokyo (JP); Hirokuni Ogihara, Tokyo (JP); Norihiko Sakamoto, Tokyo (JP); Daisuke Fujimoto, Tokyo (JP); Hikari Murai, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/894,645

(22) PCT Filed: Jun. 3, 2015

(86) PCT No.: PCT/JP2015/066056
§ 371 (c)(1),
(2) Date: Nov. 30, 2015

(87) PCT Pub. No.: WO2015/186744
PCT Pub. Date: Dec. 10, 2015

(65) Prior Publication Data
US 2017/0073481 A1    Mar. 16, 2017

(30) Foreign Application Priority Data
Jun. 4, 2014   (JP) .................................. 2014-116189

(51) Int. Cl.
*H01L 23/29*   (2006.01)
*H01L 23/00*   (2006.01)
(Continued)

(52) U.S. Cl.
CPC ................ *C08J 5/18* (2013.01); *C08G 59/18* (2013.01); *C08G 59/32* (2013.01); *C08G 59/621* (2013.01);
(Continued)

(58) Field of Classification Search
CPC ......... H01L 24/96; H01L 24/97; H01L 23/29; H01L 23/31; H01L 21/56; H01L 24/19;
(Continued)

(56) References Cited

U.S. PATENT DOCUMENTS 8,912,279 B2 * 12/2014 Nakamura .............. C08L 63/00
                                                                 524/612
9,309,446 B2 *  4/2016 Mitsukura .............. C09J 7/0203
(Continued)

FOREIGN PATENT DOCUMENTS

JP    2001-127095 A    5/2001
JP    2001-244372 A    9/2001
(Continued)

OTHER PUBLICATIONS

International Preliminary Report for Patentability of counterpart WO App. No. PCT/JP2015/066056 dated Dec. 15, 2016 in English.
(Continued)

*Primary Examiner* — Alexander Oscar Williams
(74) *Attorney, Agent, or Firm* — Fitch, Even, Tabin & Flannery, LLP

(57) ABSTRACT

A film-like epoxy resin composition includes an epoxy resin (A); a curing agent (B); a cure accelerator (C); an inorganic filler (D); and an organic solvent (E). The film-like epoxy resin composition satisfies all the following requirements (1) to (4): (1) at least one of the epoxy resin (A) and the curing agent (B) contains a component being a liquid at 25° C. in an amount of 30% by mass or more based on the total mass of the epoxy resin (A) and the curing agent (B); (2) the
(Continued)

content of a volatile portion that volatilizes by being heated at 180° C. for 10 minutes is 0.2% to 1.5% by mass based on the total amount of the epoxy resin composition; (3) the minimum melt viscosity in temperature rising from 40° C. to 200° C. is 800 Pa·s or less; and (4) the film thickness is 50 to 500 μm.

16 Claims, 5 Drawing Sheets

(51) Int. Cl.
| | |
|---|---|
| C08J 5/18 | (2006.01) |
| C08G 59/18 | (2006.01) |
| H01L 23/31 | (2006.01) |
| H01L 21/56 | (2006.01) |
| C08G 59/32 | (2006.01) |
| C08G 59/62 | (2006.01) |
| C08K 3/36 | (2006.01) |

(52) U.S. Cl.
CPC ............... *C08K 3/36* (2013.01); *H01L 21/56* (2013.01); *H01L 23/29* (2013.01); *H01L 23/295* (2013.01); *H01L 23/31* (2013.01); *H01L 24/19* (2013.01); *H01L 24/96* (2013.01); *H01L 24/97* (2013.01); *C08J 2363/00* (2013.01); *H01L 21/568* (2013.01); *H01L 2224/12105* (2013.01); *H01L 2224/97* (2013.01); *H01L 2924/0665* (2013.01); *H01L 2924/181* (2013.01); *H01L 2924/186* (2013.01)

(58) Field of Classification Search
CPC ............. H01L 21/568; H01L 2924/181; H01L 2924/00012; H01L 2224/12105; C08J 5/18; C08G 9/18; C08G 59/18
USPC ........................................................ 257/789
See application file for complete search history.

(56) References Cited

U.S. PATENT DOCUMENTS

| | | | |
|---|---|---|---|
| 2006/0029811 A1* | 2/2006 | Sugioka | C08L 63/00 428/413 |
| 2007/0205513 A1 | 9/2007 | Brunnbauer et al. | |
| 2007/0251419 A1* | 11/2007 | Yamaguchi | C08F 279/02 106/287.13 |
| 2009/0148775 A1* | 6/2009 | Murakami | C08G 59/08 429/249 |
| 2009/0203837 A1* | 8/2009 | Morita | C08G 59/3254 524/588 |
| 2012/0175159 A1* | 7/2012 | Sakauchi | B32B 43/006 174/258 |
| 2015/0332806 A1* | 11/2015 | Hayakawa | H05K 1/0353 428/336 |

FOREIGN PATENT DOCUMENTS

| | | | |
|---|---|---|---|
| JP | 3616615 B2 | | 2/2005 |
| JP | 2006-274218 A | * | 10/2006 |
| JP | 2006-274218 A | | 10/2006 |
| JP | 2009-001787 A | * | 1/2009 |
| JP | 2009-001787 A | | 1/2009 |
| JP | 2013-151655 A | | 8/2013 |
| JP | 2014-055245 A | | 3/2014 |
| JP | 2014-107295 A | | 6/2014 |
| WO | 2013/111345 A1 | | 8/2013 |
| WO | 2013111345 A1 | * | 8/2013 |
| WO | 2015/186744 A1 | * | 12/2015 ............. H01L 24/96 |

OTHER PUBLICATIONS

International Search Report for PCT/JP2015/066056 dated Aug. 25, 2015; English Translation submitted herewith (5 Pages).

* cited by examiner (a)

(b)

(c)

(a)

(b)

(c)

(d)

(e)

FILM-LIKE EPOXY RESIN COMPOSITION, METHOD OF PRODUCING FILM-LIKE EPOXY RESIN COMPOSITION, AND METHOD OF PRODUCING SEMICONDUCTOR DEVICE

TECHNICAL FIELD

The present invention relates to a film-like epoxy resin composition, in particular, a film-like epoxy resin composition that is used, for example, for sealing a semiconductor device, such as a semiconductor element, or for embedding an electronic component disposed on a printed circuit board, a method of producing the composition, and a sealing sheet including the composition, and relates to a method of producing a semiconductor device or an electronic component device using the composition or the method of producing it, and a semiconductor device and an electronic component device produced by the method.

BACKGROUND ART

Semiconductor devices have been reduced in size and thickness in association with miniaturization of electronics. Production of a semiconductor device having substantially the same size as that of a semiconductor element or implementation of semiconductor devices by, for example, package-on-package stacking a semiconductor on a semiconductor, has been enthusiastically performed. The reductions in the size and thickness of semiconductor devices are presumed to further progress in the future.

An increase in the number of terminals by the development of refinement of semiconductor elements makes the arrangement of all terminals for external connection on the semiconductor elements difficult. For example, forced arrangement of the terminals for external connection narrows the pitches between the terminals and also reduces the height of the terminals. It is therefore difficult to ensure the reliability in connection after implementation of the semiconductor device. New implement systems have been therefore variously proposed, in order to achieve the reductions in size and thickness of semiconductor devices.

For example, a method for implementation by rearranging semiconductor elements divided from a semiconductor wafer with appropriate intervals, sealing the rearranged semiconductor elements with a solid or liquid sealing resin, and further disposing terminals for external connection at the sealing portions of the semiconductor elements, and a semiconductor device produced by this method have been proposed (see, for example, Patent Literatures 1 to 4).

The rearranged semiconductor elements are usually sealed with a liquid or solid sealing resin material by molding. In the implementation system described above, the seal-molded product produced by sealing is subjected to a process of, for example, forming wiring for disposing external connection terminals and forming the external connection terminals.

Since the above-described process is performed for a seal-molded product, the number of the semiconductor devices that can be produced in each process increases with the number of the rearranged semiconductor elements. Accordingly, enlargement of the seal-molded product has been being studied. In order to use a semiconductor producing apparatus in wiring formation, currently, the seal-molded product is in a wafer shape. Accordingly, the diameter of the wafer has been increased. Separately, seal-molded products in a panel form have been studied for allowing further enlargement of the product and use of an apparatus less expensive than the semiconductor producing apparatus, such as a printed wiring board producing apparatus.

In the seal molding, molding, in which a sealing resin material is molded with a die, is employed. Conventionally, transfer molding, which performs the sealing by melting a pellet of a sealing resin material and pouring the molten sealing resin into a die, has been employed. However, since the transfer molding involves pouring of a molten resin, sealing of a large area may form an unfilled portion. Accordingly, in recent years, compression molding, in which a sealing resin material is supplied to a die or an object to be sealed in advance and molding is then performed, has been started to be used. Since the sealing material is directly supplied to an object to be sealed or a die, the compression molding has an advantage of hardly forming an unfilled portion even in sealing of a large area.

The compression molding uses a liquid or solid, sealing resin material, as in the transfer molding.

CITATION LIST

Patent Literature

Patent Literature 1: Japanese Patent No. 3616615
Patent Literature 2: Japanese Unexamined Patent Publication No. 2001-244372
Patent Literature 3: Japanese Unexamined Patent Publication No. 2001-127095
Patent Literature 4: US Unexamined Patent Publication No. 2007/205513

SUMMARY OF INVENTION

Technical Problem

Enlargement of the object to be sealed, however, causes, for example, a flow of a liquid sealing resin material, which leads to an insufficient supply of the sealing resin onto the object to be sealed and thereby making a difficulty for satisfactory embedding of the object to be sealed. In a solid sealing resin material, in order to supply a sufficient amount of the sealing resin onto an object to be sealed, a granular or powdery sealing resin material is used instead of a conventional pellet. Even in the use of a granular or powdery sealing resin material, however, supply of a sufficient amount of the sealing resin onto a die or an object to be sealed is difficult, and satisfactory embedding of the object to be sealed is difficult. Furthermore, since the solid sealing resin material used is in a granular or powdery form, the sealing resin material has a risk of becoming a source of dust contaminating the apparatus or the clean room.

In addition, in molding, since a sealing resin is molded in a die, enlargement of the die is essential for enlarging the seal-molded product. The enlargement of a die should be highly precise and therefore with an increase in the degree of difficulty in the technical aspect, the problem of a significant increase in the cost of manufacturing the die arrises.

An object of the present invention, which has been made in view of the above circumstances, is to provide a film-like epoxy resin composition having characteristics allowing the sealing resin to satisfactorily embed an object to be sealed, a method of producing the composition, and a sealing sheet including the composition, and to provide a method of producing a semiconductor device or an electronic component device using the composition or the method of producing it, and a semiconductor device and an electronic component device produced by the method.

Solution to Problem

The present inventors have studied in detail the amounts of remaining solvents and their distributions in film-like resin compositions having cracks that were formed during drying of the varnish-like resin compositions applied onto supports, in the process of investigating the production of film-like sealing resins having a low melt viscosity and sufficient flexibility, and have revealed that the amount of the solvent on the side of the support is not sufficiently decreased to cause a large difference in the amount of the solvent between the exposed side and the support side. In addition, the inventors have revealed that the amount of the solvent remaining on the support side does not decrease, even if the drying time is prolonged. The present inventors have presumed that the resin composition on the exposed side, where the drying has progressed, prevents the solvent in the resin composition on the support side from volatilizing and have diligently investigated the components of resin compositions and, as a result, it has been found that a film-like epoxy resin composition containing specific components and satisfying specific requirements can solve the above-mentioned problems. The present invention has been accomplished based on this finding.

That is, the present invention provides a film-like epoxy resin composition containing an epoxy resin (A), a curing agent (B), a cure accelerator (C), an inorganic filler (D), and an organic solvent (E) and satisfying all the following requirements (1) to (4): (1) At least one of the epoxy resin (A) and the curing agent (B) contains a component being a liquid at 25° C., in an amount of 30% by mass or more based on the total mass of the epoxy resin (A) and the curing agent (B); (2) The content of a volatile portion that volatilizes by being heated at 180° C. for 10 minutes is 0.2% to 1.5% by mass based on the total amount of the epoxy resin composition; (3) The minimum melt viscosity in temperature rising from 40° C., to 200° C., is 800 Pa·s or less; and (4) The film thickness is 50 to 500 μm.

The film-like epoxy resin composition according to the present invention has the above-described constitution and thereby can sufficiently narrow the distribution of the amount of the solvent and have a sufficient flexibility, while having a melt viscosity and film thickness that allow satisfactory embedding of an object to be sealed.

The film-like epoxy resin composition according to the present invention can be molded not only by conventional seal molding but also by lamination or pressing not using a die. The film-like epoxy resin composition according to the present invention is a film having the above-described characteristics and thereby can enlarge a seal-molded product while reducing the problem of dust emission.

Incidentally, as film-like insulating materials having embedding ability, insulating films, which are used in, for example, a semi-additive process for producing build-up multilayer printed wiring boards, are known. Since such an insulating film is used for forming fine wiring, the object to be embedded is copper wiring having a height of about 30 μm or less. The insulating film used in a method, such as a semi-additive process, usually has a thickness of 10 to 40 μm. When the object to be sealed is an electronic component or a semiconductor element, such as a silicon chip provided with devices, the thickness thereof is about 50 to 350 μm. The insulating film is therefore required to have a thickness of at least 50 μm. Therefore, the insulating film used in, for example, a semi-additive process for producing build-up multilayer printed wiring boards cannot be directly used for such an object to be sealed.

A film thickness necessary for embedding a semiconductor element or an electronic component may be obtained by bonding insulating films. When a film produced by bonding insulating films with a tool, such as a laminator, is used for sealing a silicon chip with a laminator, however, the interface of the bonding remains. The presence of such an interface has a risk of causing defects such as peeling. In particular, the presence of the interface becomes apparent with an increase in film thickness, leading to a risk of causing defects such as voids (e.g., see FIGS. 4 and 5).

When the thickness of a coating film is simply increased for producing a film having a thickness of 50 μm or more, the amount of varnish applied onto the support is increased, the amount of the solvent to be removed is increased, and the diffusion length to the exposed side (the air side) being a drying surface is increased. Production of a film using conventional composition and drying conditions cannot sufficiently remove the solvent and increases the amount of the solvent remaining in the film-like insulating material. The remaining solvent causes defects, such as swelling, during the heat curing. As described above, removal of the solvent on the support side is particularly difficult.

In order to reduce the amount of the solvent that should be removed, it is considered that the varnish be concentrated. In a system containing an inorganic filler, however, dispersion of the inorganic filler and dissolution of the resin is difficult.

Enhancement of the drying conditions for accelerating the volatilization of the solvent during film formation causes a defect, cracking of the film-like insulating material, leading to difficulty in handling as the film. In contrast, when the drying conditions are weakened, although a film may be formed without defects, such as cracking, the stickiness of the film-like insulating material may increase with time. Furthermore, this sticky film-like insulating material causes defects, such as foaming, during the heat curing.

The film-like epoxy resin composition according to the present invention contains the components (A) to (E) and satisfies the requirement (1) and is prepared such that the requirements (2) to (4) are satisfied. As a result, the film-like epoxy resin composition can prevent the above-described problems and can produce a good seal-molded product even if the object to be sealed is an electronic component or a semiconductor element, such as a silicon chip provided with devices.

The present inventors believe that the reasons for providing the above-mentioned advantageous effects are as follows. The composition satisfying the requirement (1) probably prevents excess drying occurring on the exposed side (the air side) of the coating film in the drying process and can adjust the content of the volatile portion (in particular, organic solvent) to 0.2% to 1.5% by mass in the film-like epoxy resin composition without preventing the volatilization of the solvent on the support side. Consequently, a semiconductor element or an electronic component can be embedded without causing defects, such as swelling. An appropriate amount of an organic solvent imparts viscosity and fluidity to the film-like epoxy resin composition, allows easy peeling from a support, prevents cracking and other defects of the film-like epoxy resin composition itself, and provides an appropriate minimum melt viscosity, which also probably contribute to good embedding properties. Furthermore, the satisfaction of the requirement (1) probably allows the component being a liquid at 25° C. to function as a binding agent for each component in the film-like epoxy resin composition, and thereby the film-like epoxy resin composition is prevented from cracking when it is formed into a film having a thickness of 50 to 500 μm or is prevented from peeling from the support when it is formed into a sealing sheet. When the component being a liquid at 25° C. is the component (A) and/or the component (B), the component is incorporated into the structure of the cured product after the heat curing, and occurrence of the defects caused by the component being a liquid is prevented.

The film-like epoxy resin composition according to the present invention can avoid formation of an interface, which is formed by bonding two or more sheets of a film-like epoxy resin composition.

In addition, the film-like epoxy resin composition can have a ratio of the content of the organic solvent (E) in one surface to that in the other surface of 0.2 to 5.0, where each content is calculated based on the absorption of the organic solvent (E) measured by FT-IR (total reflection method) of both surfaces of the film-like epoxy resin composition.

The present invention also provides a method of producing a film-like epoxy resin composition. The method includes a step of limning, on a support, a coating film of an varnish-like epoxy resin composition containing an epoxy resin (A), a curing agent (B), a cure accelerator (C), an inorganic filler (D), and an organic solvent (E) and satisfying the following requirement (1); and a step of drying the coating film with heat to form a film-like epoxy resin composition satisfying all the following requirements (2) to (4). Requirement (1): at least one of the epoxy resin (A) and the curing agent (B) contains a component being a liquid at 25° C. in an amount of 30% by mass or more based on the total mass of the epoxy resin (A) and the curing agent (B); Requirement (2): the content of a volatile portion that volatilizes by being heated at 180° C. for 10 minutes is 0.2% to 1.5% by mass based on the total amount of the epoxy resin composition; Requirement (3): the minimum melt viscosity in temperature rising from 40° C. to 200° C. is 800 Pa·s or less; and Requirement (4): the film thickness is 50 to 500 μm.

The heat drying of the coating film can include heating of the coating film for a period of time of 25% or more of the total drying time at a temperature within a range of ±10° C. of the boiling point of the component (E).

The coating film can be dried with heat such that the ratio of the content of the organic solvent (E) in one surface of the film-like epoxy resin composition to that in the other surface is 0.2 to 5.0, where each content is calculated based on the absorption of the organic solvent (E) measured by FT-IR (total reflection method) of both surfaces of the film-like epoxy resin composition.

The present invention also provides a sealing sheet including a film-like support and the film-like epoxy resin composition according to the present invention or a film-like epoxy resin composition prepared by the method according to the present invention disposed on the support.

The present invention also provides a method of producing a semiconductor device. The method includes a step of pressing the film-like epoxy resin composition according to the present invention or a film-like epoxy resin composition prepared by the method according to the present invention to a semiconductor element while heating to embed the semiconductor element in the film-like epoxy resin composition and a step of curing the film-like epoxy resin composition embedding the semiconductor element.

The present invention also provides a method of producing an electronic component device. The method includes a step of pressing the film-like epoxy resin composition according to the present invention or a film-like epoxy resin composition prepared by the method according to the present invention to an electronic component while heating to embed the electronic component in the film-like epoxy resin composition and a step of curing the film-like epoxy resin composition embedding the electronic component.

The present invention also provides a semiconductor device including a semiconductor element and a sealing portion embedding the semiconductor element and being made of a cured product of the film-like epoxy resin composition according to the present invention or a film-like epoxy resin composition prepared by the method according to the present invention.

The present invention also provides an electronic component device including an electronic component and a sealing portion embedding the electronic component and being made of a cured product of the film-like epoxy resin composition according to the present invention or a film-like epoxy resin composition prepared by the method according to the present invention.

Advantageous Effects of Invention

The present invention can provide a film-like epoxy resin composition having characteristics allowing the sealing resin to satisfactorily embed an object to be sealed, a method of producing the composition, and a sealing sheet including the composition, and to provide a method of producing a semiconductor device or an electronic component device using the composition or the method of producing it, and a semiconductor device and an electronic component device produced by the method.

The film-like epoxy resin composition according to the present invention can achieve a sufficient supply of a sealing resin to an object to be sealed and a reduction in dust emission, which are challenges in formation of a large-scaled seal-molded product, and can be molded not only by molding of conventional seal molding but also by lamination or pressing not using a die.

DESCRIPTION OF EMBODIMENTS

Figure 1:
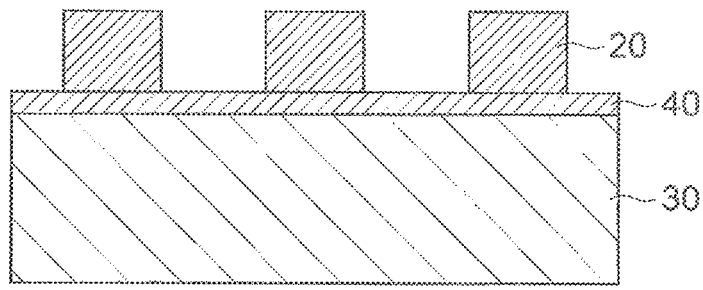
FIG. 1 includes schematic cross-sectional views for explaining an embodiment of a method of producing a semiconductor device.
Figure 1:
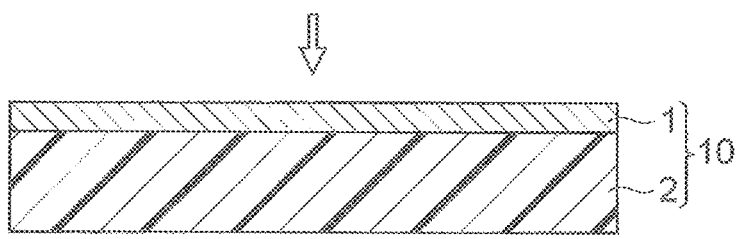
Figure 1:
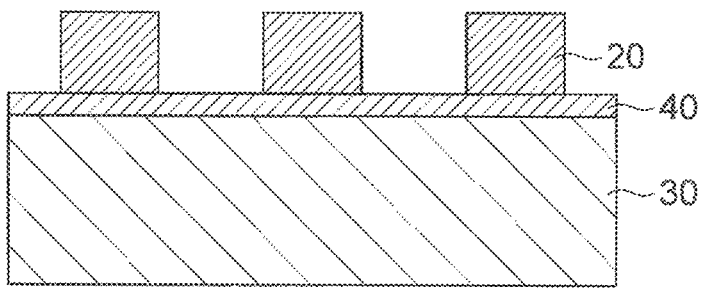
Figure 1:
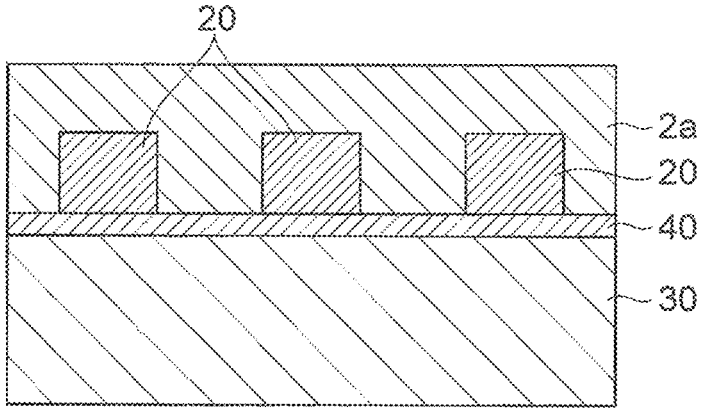

Preferred embodiments of the present invention now be described in detail with reference to the drawings.

The film-like epoxy resin composition of this embodiment contains an epoxy resin (A) (hereinafter, also may be referred to as component (A)), a curing agent (B) (hereinafter, also may be referred to as component (B)), a cure accelerator (C) (hereinafter, also may be referred to as component (C)), an inorganic filler (D) (hereinafter, also may be referred to as component (D)), and an organic solvent (E) (hereinafter, also may be referred to as component (E)), and the film-like epoxy resin composition satisfies all the following requirements (1) to (4): (1) at least one of the component (A) and the component (B) contains a component being a liquid at 25° C. in an amount of 30% by mass or more based on the total mass of the component (A) and the component (B); (2) the content of a volatile portion that volatilizes by being heated at 180° C. for 10 minutes is 0.2% to 1.5% by mass based on the total amount of the epoxy resin composition; (3) the minimum melt viscosity in temperature rising from 40° C. to 200° C. is 800 Pa·s or less; and (4) the film thickness is 50 to 500 μm.

Throughout the specification, the component being a liquid at 25° C., i.e., an epoxy resin being a liquid at 25° C. or a curing agent being a liquid at 25° C., refers to a compound having a viscosity of 400 Pa·s or less at 25° C. measured with a B-type viscometer.

The film-like epoxy resin composition of the embodiment has the above-mentioned constitution and thereby can satisfactorily embed an electronic component, such as a semiconductor element.

The component (A) may be any epoxy resin, but is preferably an epoxy resin including two or more glycidyl groups in one molecule. The component (A) may be a single epoxy resin or a mixture of two or more of epoxy resins.

Examples of the epoxy resin as the component (A) include bisphenol A epoxy resin, bisphenol AP epoxy resin, bisphenol AF epoxy resin, bisphenol B epoxy resin, bisphenol BP epoxy resin, bisphenol C epoxy resin, bisphenol E epoxy resin, bisphenol F epoxy resin, bisphenol G epoxy resin, bisphenol M epoxy resin, bisphenol S epoxy resin, bisphenol P epoxy resin, bisphenol PH epoxy resin, bisphenol TMC epoxy resin, bisphenol Z epoxy resin, bisphenol S epoxy resins such as hexanediol bisphenol S diglycidyl ether, novolac phenol epoxy resin, biphenyl epoxy resin, naphthalene epoxy resin, dicyclopentadiene epoxy resin, bixylenol epoxy resins such as bixylenol diglycidyl ether, and hydrogenated bisphenol A epoxy resins such as hydrogenated bisphenol A glycidyl ether; dibasic acid-modified diglycidyl ether epoxy resins thereof; and aliphatic epoxy resins.

In the embodiment, the epoxy resin may be a commercial product. Examples of the commercially available epoxy resin include EXA4700 (tetrafunctional naphthalene epoxy resin) manufactured by DIC Corporation; naphthalene epoxy resins, such as NC-7000 (naphthalene skeleton-containing polyfunctional solid epoxy resin) manufactured by Nippon Kayaku Co., Ltd.; epoxy compounds (trisphenol epoxy resins) of condensation products of phenols, such as EPPN-502H (trisphenol epoxy resin) manufactured by Nippon Kayaku Co., Ltd., and aromatic aldehydes having phenolic hydroxyl groups; dicyclopentadiene aralkyl epoxy resins, such as Epiclon HP-7200H (dicyclopentadiene skeleton-containing polyfunctional solid epoxy resin) manufactured by DIC Corporation; biphenyl aralkyl epoxy resins, such as NC-3000H (biphenyl skeleton-containing polyfunctional solid epoxy resin) manufactured by Nippon Kayaku Co., Ltd.; novolac epoxy resins, such as Epiclon N660 and Epiclon N690 manufactured by DIC Corporation and EOCN-104S manufactured by Nippon Kayaku Co., Ltd.; tris(2,3-epoxypropyl)isocyanurates, such as TEPIC manufactured by Nissan Chemical Industries, Ltd.; bisphenol A epoxy resins, such as Epiclon 860, Epiclon 900-IM, Epiclon EXA-4816, and Epiclon EXA-4822 manufactured by DIC Corporation, Araldite AER280 manufactured by Asahi-Chiba Limited, Epototo YD-134 manufactured by Tohto Kasei Co., Ltd., JER834 and JER872 manufactured by Mitsubishi Chemical Corporation, ELA-134 manufactured by Sumitomo Chemical Co., Ltd., Epikote series 807, 815, 825, 827, 828, 834, 1001, 1004, 1007, and 1009 manufactured by Yuka Shell Epoxy K.K., DER-330, 301, and 361 manufactured by The DOW Chemical Company, and bisphenol A epoxy resins, such as YD8125 and YDF8170 manufactured by Tohto Kasei Co., Ltd.; bisphenol F epoxy resins, such as JER806 manufactured by Mitsubishi Chemical Corporation; naphthalene epoxy resins, such as Epiclon HP-4032 manufactured by DIC Corporation; naphthalene epoxy resins, such as Epiclon HP-4032 manufactured by DIC Corporation; phenol novolac epoxy resins, such as Epiclon N-740 manufactured by DIC Corporation; and aliphatic epoxy resins, such as Denacol DLC301 manufactured by Nagase ChemteX Corporation. These epoxy resins may be used alone or in combination of two or more thereof.

The epoxy resin as the component being a liquid at 25° C. preferably includes two or more glycidyl groups in one molecule and more preferably includes a bisphenol skeleton, in particular, a bisphenol A, bisphenol B, bisphenol C, bisphenol E, bisphenol F, bisphenol or bisphenol Z skeleton. Many of the epoxy resins being a liquid at 25° C. have low molecular weights, which tends to be disadvantageous from the viewpoint of heat resistance. The above-mentioned epoxy resins, however, include phenol skeletons having excellent heat stability and thereby can have satisfactory heat resistance.

The content of the component (A) in the film-like epoxy resin composition of the embodiment is preferably 3% to 30% by mass, more preferably 4% to 25% by mass, and most preferably 5% to 20% by mass; based on the total amount of the film-like epoxy resin composition from the view point of the physical properties of cured films.

The component (B) may be any curing agent, but is preferably a curing agent including two or more groups reactive with glycidyl groups in one molecule. The component (B) may be a single curing agent or a mixture of two or more of curing agents.

Examples of the component (B) include phenolic resins, acid anhydrides, imidazole compounds, aliphatic amines, and alicyclic amines.

The phenolic resin may be any phenolic resin including two or more phenolic hydroxyl groups in one molecule, and may be any known phenolic resin. Examples of the phenolic resin include resins prepared by condensation or cocondensation of a phenol, such as phenol, cresol, xylenol, resorcinol; catechol, bisphenol A, or bisphenol F, or a naphthol, such as α-naphthol; β-naphthol, or dihydroxynaphthalene, and an aldehyde, such as formaldehyde, acetaldehyde, propionaldehyde, benzaldehyde, or salicylaldehyde, in the presence of an acid catalyst; biphenyl skeleton type phenolic resins; para-xylylene-modified phenolic resins; meta-xylylene/para-xylylene-modified phenolic resins; melamine-modified phenolic resins; terpene-modified phenolic resins; dicyclopentadiene-modified phenolic resins; cyclopentadiene-modified phenolic resins; polycyclic aromatic ring-modified phenolic resins; and xylylene-modified naphthol resins.

In the embodiment, the curing agent may be a commercial product. Examples of the commercially available phenolic resin include Phenolite LF2882, Phenolite LF2822, Phenolite TD-2090, Phenolite TD-2149, Phenolite NTH-4150, and Phenolite VH4170 manufactured by DIC Corporation; PAPS-PN manufactured by Asahi Organic Chemicals Industry Co., Ltd.; XLC-LL and XLC-4L manufactured by Mitsui Chemicals, Inc.; SN-100, SN-180, SN-300, SN-395, and SN-400 manufactured by Nippon Steel & Sumikin Chemical Co., Ltd.; TrisP-HAP, TrisP-PA, TrisP-PHBA, CyRS-PRD4, and MTPC manufactured by Honshu Chemical Industry Co., Ltd.; and SK Resin HE910-10 manufactured by Air Water Inc.

The curing agent as a component being a liquid at 25° C. preferably has two or more functional groups reactive with glycidyl groups in one molecule, and examples thereof include phenolic resins, acid anhydrides, imidazole compounds, aliphatic amines, and alicyclic amines. These curing agents may be used alone or in combination of two or more thereof.

The phenolic resin being a liquid at 25° C. preferably includes a bisphenol skeleton. Example of the bisphenol skeleton include bisphenols, such as bisphenol A, bisphenol F, bisphenol AD, and bisphenol S; dihydroxybiphenyls, such as 4,4'-dihydroxybiphenyl; dihydroxyphenyl ethers, such as bis(4-hydroxyplienyl) ether; these phenol skeletons having a straight chain alkyl group, a branched alkyl group, an aryl group, a hydroxyalkyl group, an ally group, an alicyclic group, or another substituent introduced into the aromatic rings thereof; and polycyclic bifunctional phenols having a straight chain alkyl group, a branched alkyl group, an allyl group, a substituent-containing allyl group, an alicyclic group, an alkoxycarbonyl group, or another substituent on the central carbon atoms of these bisphenol skeletons.

The content of the component (B) in the film-like epoxy resin composition of the embodiment is preferably determined such that the ratio of the equivalent of the glycidyl group of the component (A) to the equivalent of the functional group reactive with the glycidyl group of the component (B) ([equivalent of the glycidyl group of epoxy resin]/[equivalent of the functional group reactive with the glycidyl group of curing agent]) is 0.7 to 2.0, in order to provide desired physical properties to cured films without being disturbed by the remaining unreacted component (A) or component (B). From the same viewpoint, the ratio is more preferably 0.8 to 1.8 and most preferably 0.9 to 1.7.

The component (C) may be any cure accelerator, but is preferably an amine, imidazole, urea, or phosphorus cure accelerator. Examples of the amine cure accelerator include 1,8-diazabicyclo[5.4.0]undecene-7 and 1,5-diazabicyclo[4.3.0]nonene-5. Examples of the imidazole cure accelerator include 2-ethyl-4-methyl imidazole and 1-cyanoethyl-2-ethyl-4-methyl imidazole. Examples of the urea cure accelerator include 3-phenyl-1,1-dimethylurea. Examples of the phosphorus cure accelerator include triphenylphosphine and addition reaction products thereof, (4-hydroxyphenyl)diphenylphosphine, bis(4-hydroxyphenyl)phenylphosphine, and tris(4-hydroxyphenyl)phosphine. Since a large number of derivatives of imidazole are known, an imidazole cure accelerator having a desired activating temperature can be easily obtained. Among the above-mentioned cure accelerators, therefore, the imidazole cure accelerators are particularly preferred. Commercially available examples of the imidazole cure accelerator include 2PHZ-PW and 2P4MZ manufactured by Shikoku Chemicals Corporation.

The content of the component (C) in the film-like epoxy resin composition of the embodiment is preferably 0.01% to 5% by mass, more preferably 0.1% to 3% by mass, and most preferably 0.3% to 1.5% by mass, based on the total mass of the component (A) and the component (B). The component (C) as a content in the above-mentioned range can provide a sufficient curing-accelerating effect and also can prevent curing from progressing in the steps (e.g., application and drying) of producing the film-like epoxy resin composition or during the storage of the film-like epoxy resin composition to inhibit cracking of the film-like epoxy resin composition and molding failure due to an increase in melt viscosity.

The component (D) may be any conventionally known inorganic filler. Examples of the inorganic filler include barium sulfate, barium titanate, amorphous silica, crystalline silica, fused silica, spherical silica, talc, clay, magnesium carbonate, calcium carbonate, aluminum oxide, aluminum hydroxide, silicon nitride, and aluminum nitride. Silicas are preferred, because they can be readily improved in the dispersibility in resins and inhibited from precipitating in varnish by, for example, surface modification and also have relatively low coefficients of thermal expansion to readily provide desired characteristics to cured films.

Surface modification of the inorganic filler may be performed by any procedure, but treatment with a silane coupling agent is preferred because of its simplicity and its variety of functional groups to easily providing desired characteristics. Examples of the silane coupling agent include alkylsilane, alkoxysilane, vinylsilane, epoxysilane, aniinosilane, acrylsilane, methacrylsilane, mereaptosilane, sulfidosilane, isocyanatosilane, sulfursilane, styryisilane, and alkylchlorosilane.

Examples of the specific compounds include methltrimethoxysilane, dimethyldimethoxysilane, trimethylmethoxysilane, methyltriethoxysilane, methyltriphenoxysilane, ethyltrimethoxysilane, n-propyltrimethoxysilane, diisopropyldimethoxysilane, isobutyltrimethoxysilane, diisobutyldimethoxysilane, isobutyltriethoxysilane, n-hexyltrimethoxysilane; n-hexyltriethoxysilane, cyclohexylmethyldimethoxysilane, n-octyltriethoxysilane, n-dodecylmethoxysilane, phenyltrimethoxysilane, diphenyldimethoxysilane, triphenylsilanol, methyltrichlorosilane, dimethyldichlorosilane, trimethylchlorosilane, n-octyldimethylchlorosilane, tetraethoxysilane, 3-aminopropyltrimethoxysilane, 3-aminopropyltriethoxysilane, 3-(2-aminoethyl)aminopropyltrimethoxysilane, 3-(2-aminoethyl)aminopropylmethyldimethoxysilane, 3-phenylaminopropyltrimethoxysilane, 3-glycidoxypropyltrimethoxysilane, 3-glycidoxypropylmethyldimethoxysilane, 3-glycidoxypropyltriethoxysilane, 3-glycidoxypropylmethyldimethoxysilane, bis(3-(triethoxysilyl)propyl)disulfide, bis(3-(triethoxysilyl)propyl)tetrasulfide, vinyltriacetoxysilane, vinyltrimethoxysilane, vinyltriethoxysilane, vinyltriisopropoxysilane, allyltrimethoxysilane, diallyldimethylsilane, 3-methacryloxypropyltrimethoxysilane, 3-methacryloxypropylmethyldimethoxysilane, 3-methacryloxypropyltriethoxysilane, 3-mercaptopropyltrimethoxysilane, 3-mercaptopropylmethyldimethoxysilane, 3-mercaptopropyltriethoxysilane, N-(1,3-dimethylbutylidene)-3-aminopropyltriethoxysilane, and aminosilane. These silane coupling agents may be used alone or in combination of two or more thereof.

The inorganic filler preferably has an average particle diameter of 0.01 to 50 µm, more preferably 0.1 to 25 µm, and most preferably 0.3 to 10 µm. In this range of the particle diameter, the inorganic filler is prevented from aggregating, can be satisfactorily dispersed, and is prevented from precipitating in varnish during the production of a film-like epoxy resin composition.

The content of the component (D) in the film-like epoxy resin composition of the embodiment is preferably 30% to 95% by mass and more preferably 50% to 90% by mass based on the total amount of the film-like epoxy resin composition. The component (D) as a content in the above-mentioned range can prevent expansion of the warp of the semiconductor device or electronic component device due to the difference in the coefficient of thermal expansion from that of the object to be sealed and also can prevent cracking in the drying step of the production of the film-like epoxy resin composition and a defect of insufficient sealing of the object to be sealed, such as a semiconductor element or electronic component, due to an increase in the melt viscosity of the film-like epoxy resin composition.

The component (E) may be any conventionally known organic solvent. The organic solvent preferably dissolves the components other than the inorganic filler, and examples thereof include aliphatic hydrocarbons, aromatic hydrocarbons, terpenes, halogens, esters, ketones, alcohols, and aldehydes.

Specifically, the organic solvent is preferably an ester, a ketone, or an alcohol. These solvents are low in the environmental load and can readily dissolve the component (A) and component (B). Among these solvents, in particular, ketones readily dissolve the component (A) and component (B) and are more preferred. Furthermore, acetone, methyl ethyl ketone, and methyl isobutyl ketone hardly volatilize at room temperature and can be readily removed in a drying step and are most preferred.

The organic solvent can prepare varnish in which the components constituting the film-like epoxy resin composition of the embodiment are dissolved or dispersed or can assist the preparation of such varnish.

The content of the organic solvent in the film-like epoxy resin composition is preferably 0.2% to 1.5% by mass and more preferably 0.3% to 1% by mass based on the total amount of the film-like epoxy resin composition. The solvent as a content in the above-mentioned range can prevent defects, such as cracking of films, and can readily provide a sufficient minimum melt viscosity, and also can prevent a problem of a reduction in handleability due to excessively high adhesiveness and defects, such as foaming, accompanied by volatilization of the organic solvent during the heat curing.

In the embodiment, from the viewpoint of obtaining a sufficient minimum melt viscosity, the content of the organic solvent can be 0.5% to 1.5% by mass, higher than 0.5% by mass and not higher than 1.0% by mass, based on the total amount of the film-like epoxy resin composition.

The film-like epoxy resin composition of the embodiment can contain a stress relaxation agent.

The stress relaxation agent can be an elastomer, and examples thereof include liquid butadiene, styrene butadiene particles, butadiene particles, silicone powder, silicone oil, and silicone oligomers.

The film-like epoxy resin composition of the embodiment can contain other additives in the range that does not impair the advantageous effects of the present invention. Examples of such additives include flame retardants, pigments, dyes, mold releasing agents, antioxidants, and regulators of surface tension.

The film-like epoxy resin composition of the embodiment satisfies the requirement (1): at least one of the component (A) and the component (B) contains a component being a liquid at 25° C.; and the total content of the component being a liquid at 25° C. is 30% by mass or more based on the total mass of the component (A) and the component (B). In a case of using the composition as a sealing sheet provided with a protective film, the total content of the component is preferably 30% to 80% by mass, more preferably 30% to 70% by mass, from the viewpoint of good releasability from the protective film.

The film-like epoxy resin composition of the embodiment satisfies the requirement (2): the content of a volatile portion that volatilizes by being heated at 180° C. for 10 minutes is 0.2% to 1.5% by mass based on the total amount of the epoxy resin composition. The content of the volatile portion is preferably 0.3% to 1.0% by mass, more preferably 0.5% to 1.0% by mass, from the viewpoint of obtaining a sufficient minimum melt viscosity, preventing a reduction in the handleability of the film-like epoxy resin composition, and preventing foaming and other defects accompanied by volatilization of the organic solvent during the heat curing.

The film-like epoxy resin composition of the embodiment satisfies the requirement (3): the minimum melt viscosity temperature rising from 40° C. to 200° C. is 800 Pa·s or less. The minimum melt viscosity is preferably 400 Pa·s or less from the viewpoint of satisfactorily embedding a semiconductor element or electronic component, and is more preferably 0.1 to 400 Pa·s, most preferably 0.1 to 200 Pa·s, from the viewpoint of maintaining the shape of the film-like epoxy resin composition in lamination molding.

The minimum melt viscosity is measured as follows. The film-like epoxy resin composition (0.6 g) is molded into a tablet having a diameter of 2 cm with a compacting machine The viscosity is measured while the temperature of this tablet being increased from 40° C. to 200° C., and the lowest viscosity is defined as the minimum melt viscosity.

Measuring device: rheometer, product name: ARES-2KSTD manufactured by Rheometric Scientific, Inc.
Measurement mode: Dynamic Temperature Ramp
Frequency: 0.1 Hz
Temperature range: 40° C. to 200° C.
Rate of temperature increase: 5° C./min The film-like epoxy resin composition of the embodiment satisfies the requirement (4): the film thickness is 50 to 500 μm. The thickness is preferably 50 to 350 μm, more preferably 50 to 300 μm, from the viewpoint of reducing the variation in the thickness of the film-like epoxy resin composition. A film thickness of 50 to 350 μm is suitable for embedding electronic components.

The film-like epoxy resin composition according to the embodiment can avoid formation of an interface that is formed by bonding two or more sheets of a film-like epoxy resin composition and therefore can prevent defects, such as peeling, caused by the presence of the interface between the sheets of the film-like epoxy resin composition.

The film-like epoxy resin composition of the embodiment preferably has a ratio of the content of the component (E) in one surface to that in the other surface of 0.2 to 5.0, where each content is calculated based on the absorption of the component (E) measured by FT-IR (total reflection method) of both surfaces of the film-like epoxy resin composition.

The content ratio of the component (E) based on FT-1R measurement is determined by the following procedure. The film-like support or the protective film is peeled to expose the film-like epoxy resin composition, and both surfaces of the film-like epoxy resin composition are subjected to the measurement by a total reflection method. For example, in a case of using methyl isobutyl ketone as the component (E), the content of the component (E) can be calculated as a ratio of the absorption intensity at 1705 cm$^{-1}$ caused by the carbonyl (C=O) of methyl isobutyl ketone to the absorption intensity at 1610 cm$^{-1}$ caused by the benzene ring in the film-like epoxy resin composition. The ratio of the content of the component (E) in one surface to that in the other surface is the ratio of the contents calculated by the above-described method.

Alternatively, the distribution of the organic solvent may be directly evaluated by TOF-SIMS analysis of an inclined plane having a very gentle slope formed with a sharp edged cutting blade.

The film-like epoxy resin composition according to the embodiment can be produced by, for example, as follows.

An epoxy resin (A), a curing agent (B), a cure accelerator (C), an inorganic filler (D), and an organic solvent (E) are mixed to produce varnish. The mixing may be performed with any tool, but a mill, mixer, or stirring blade, or another tool can be used.

The thus-prepared varnish is applied to a film-like support, and the resulting coating film is then heat-dried by, for example, blowing hot air to produce a film-like epoxy resin composition. The application may be performed by any coating process, but a die coater, a comma coater, or another tool can be used.

Any film-like support may be used. For example, a polymer film or metal foil can be used.

Examples of the polymer film include polyolefin films, such as polyethylene films and polypropylene films; polyester films, such as polyethylene terephthalate films; polyvinyl chloride films; polycarbonate films; acetyl cellulose films; polyimide films; polyamide films; and tetrafluoroethylene films. Examples of the metal foil include copper foil and aluminum foil.

The film-like support may have any thickness, but the thickness is preferably 2 to 200 µm from the viewpoint of working properties and drying properties. Such a thickness can prevent defects, such as breakage of the support during application and warping by the weight of the varnish. In addition, the use of a dryer blowing hot air to both the application surface and the rear surface can prevent a defect of inhibiting drying of the solvent in the varnish.

In the embodiment, a protective layer protective film) may be formed on the film-like epoxy resin composition applied onto a film-like support for the purpose of protection. The formation of the protective layer improves the handleability and can avoid defects, such as adhesion of the film-like epoxy resin composition to the rear surface of the film-like support, even if the film-like epoxy resin composition is wound.

Any protective layer may be used. For example, a polymer film or metal foil can be used. Examples of the polymer film include polyolefin films, such as polyethylene films and polypropylene films; polyester films, such as polyethylene terephthalate films; polyvinyl chloride films; polycarbonate films; acetyl cellulose films; and tetrafluoroethylene films. Examples of the metal foil include copper foil and aluminum foil.

The protective layer may have any thickness, but the thickness is preferably 12 to 100 µm from the viewpoint of achieving a sufficient protecting effect and reducing the thickness in winding the film-like epoxy resin composition into a roll.

The heat drying of the coating film can include heating of the coating film for a period of time of 25% or more of the total drying time at a temperature within a range of ±10° C. of the boiling point of the component (E). The heat drying can be performed by a step composed of two or more stages at different heating temperatures. In such a case, the heat drying is preferably started from the stage of a lower temperature, and the heating temperature of the subsequent stage is preferably higher than that at the prior stage by +30° C. or less.

In the embodiment, the coating film is preferably heat-dried such that the ratio of the content of the component (E) in one surface to that in the other surface is 0.2 to 5.0, where each content is calculated based on the absorption of the component (E) measured by FT-IR (total reflection method) of both surfaces of the film-like epoxy resin composition. Such a ratio is determined by the above-described procedure.

The embodiment can provide a sealing sheet including a film-like support and the film-like epoxy resin composition according to the embodiment on the support. The sealing sheet may include a protective layer, such as a protective film, on the film-like epoxy resin composition on the opposite side of the support side.

A method of producing an electronic component device using the film-like epoxy resin composition of the embodiment will now be described. In the embodiment, a method of producing a semiconductor device including a semiconductor element as the electronic component will be specifically described.

Figure 2:
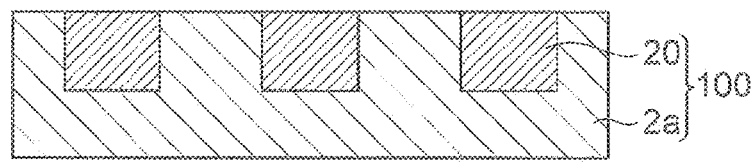
FIG. 2 includes schematic cross-sectional views for explaining embodiment of the method of producing a semiconductor device.
Figure 2:
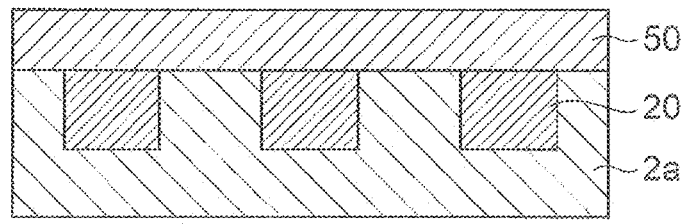
Figure 2:
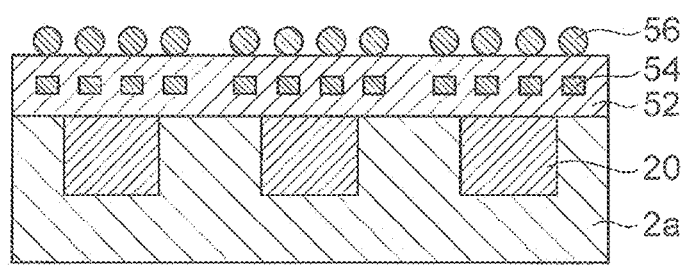
Figure 2:
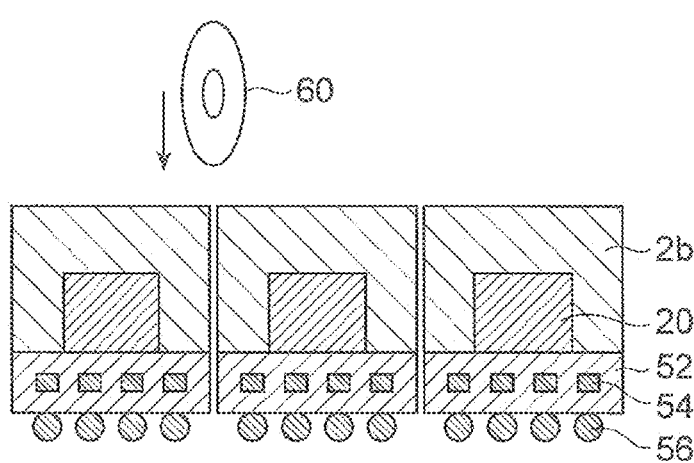
Figure 2:
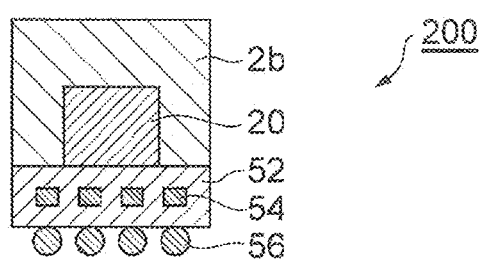

FIGS. 1 and 2 are schematic cross-sectional views for explaining an embodiment of the method of producing a semiconductor device. The method according to the embodiment includes a step (FIGS. 1(*a*) and (*b*)) of arranging a sealing sheet 10 including a support 1 and a film-like epoxy resin composition 2 disposed on the support 1 so as to face objects to be embedded, semiconductor elements 20, aligned on a substrate 30 provided with a temporary fixing material 40 and pressing the film-like epoxy resin composition 2 to the semiconductor elements 20 while heating to embed the semiconductor elements 20 into the film-like epoxy resin composition 2; and a step (FIG. 1 (*c*)) of curing the film-like epoxy resin composition in which the semiconductor elements are embedded. The embodiment provides a seal-molded product of semiconductor elements 20 embedded in the heat cured product 2*a* of the film-like epoxy resin composition by lamination molding. The seal-molded product may be prepared by compression molding.

Any laminator may be used. For example, a roll type or balloon type laminator can be used. In particular, from the viewpoint of embedding properties, a balloon type that can perform vacuum pressurization is preferred.

The lamination is usually performed at a temperature not higher than the softening point of the film-like support. The lamination temperature is preferably near the temperature showing the minimum melt viscosity of the film-like epoxy resin composition. The pressure during the lamination varies depending on the size and the density of the semiconductor elements or electronic components to be embedded and is preferably 0.2 to 1.5 MPa and more preferably 0.3 to 1.0 MPa. The lamination may be performed for any period of time and is preferably performed for 20 to 600 seconds, more preferably 30 to 300 seconds, and most preferably 40 to 120 seconds.

The curing can be performed in, for example, the air or an inert gas. The curing may be performed at any temperature and is preferably performed at 80° C. to 280° C., more preferably 100° C. to 240° C., and most preferably 120° C. to 200° C. In curing at 80° C. or more, the film-like epoxy resin composition is sufficiently hardened to prevent occurrence of defects. In curing at 280° C. or less, heat damage of other materials can be prevented. The curing may be performed for any period of time and is preferably performed for 30 to 600 minutes, more preferably 45 to 300 minutes, and most preferably 60 to 240 minutes. In curing for such a period of time, the film-like epoxy resin composition is sufficiently hardened to give a satisfactory production efficiency. A plurality of conditions for curing may be combined.

In the embodiment, a semiconductor device can be provided. through the following formation of insulating layer, formation of wiring pattern, ball mounting, and dicing.

An insulating layer 50 is disposed on the seal-molded product 100 peeled from the substrate 30 on the side exposing the semiconductor element 20 (FIGS. 2 (a) and (b)). A wiring pattern is formed on the insulating layer 50, and ball mounting is then performed to form an insulating layer 52, wiring 54, and balls 56.

The seal-molded product is divided with a dicing cutter 60 to obtain semiconductor devices 200.

Preferred embodiments of the film-like epoxy resin composition and the method of producing a semiconductor device according to the present invention have been described above. The present invention is not necessarily limited to the above-described embodiments and may be appropriately modified within a scope not departing from the gist of the invention.

EXAMPLES

The present invention will now be described more specifically by examples and comparative examples, but the invention is not limited to the following examples.

The following compounds were prepared for constituting a film-like epoxy resin composition.
[Epoxy Resin]
A1: aliphatic epoxy resin (manufactured by Nagase ChemteX Corporation, EX216; epoxy equivalent: 150, a liquid state at 25° C.)
A2: bisphenol F epoxy resin (manufactured by Mitsubishi Chemical Corporation, jER806; epoxy equivalent: 160, a liquid state at 25° C.)
A3: hexanediol-containing bisphenol A epoxy resin (manufactured by DIC Corporation, EXA-4850-1000; epoxy equivalent: 350)
A4: biphenyl skeleton-containing polyfunctional solid epoxy resin (manufactured by Nippon Kayaku Co., Ltd., NC-3000H; epoxy equivalent: 289, not a liquid state at 25° C. (>400 Pa·s)
[Curing Agent]
B1: phenol novolac resin (manufactured by Asahi Organic Chemicals Industry Co., Ltd., PAPS-PN2; hydroxyl equivalent: 104, not a liquid state at 25° C. (>400 Pa·s)
B2: acid anhydride (manufactured by Hitachi Chemical Company, Ltd., MHAC-P)
[Cure Accelerator]
C1: imidazole (manufactured by Shikoku Chemicals Corporation, 2PHZ-PW)
C2: imidazole (manufactured by Shikoku Chemicals Corporation, 2P4MZ)
[Inorganic Filler]
D1: silica (manufactured by Admatechs Co., Ltd., SX-E2; phenyl aininosilane treatment, average particle diameter: 5.8 µm)
[Organic Solvent]
E1: methyl isobutyl ketone E2: methyl ethyl ketone
[Stress Relaxation Agent]
F1: silicone powder manufactured by Shin-Etsu Chemical Co., Ltd., KW-605)
<Production of Film-like Epoxy Resin Composition>

Example 1

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A1 (300 g), epoxy resin A4 (200 g), and curing agent B1 (500 g), followed by stirring. After visual confirmation of dissolution of the curing agent B1, cure accelerator C1 (2.5 g) was added thereto. The mixture was further stirred for 1 hour and was filtered through a nylon mesh #200 (aperture: 75 µm). The filtrate was collected as a varnish-like epoxy resin composition. This varnish-like epoxy resin composition was applied onto a film-like support (polyethylene terephthalate film having a thickness of 38 µm) with a coater under the following conditions to produce a film-like epoxy resin composition having a film thickness of 250 µm A protective film (polyethylene terephthalate film having a thickness of 12 µm) was further bonded to the film-like epoxy resin composition to prepare a sealing sheet having a configuration composed of support/film-like epoxy resin composition/protective film.

Coating head system: comma
Coating and drying rate: 1 m/min
Drying conditions (temperature/furnace length): 110° C./3.3 in, 130° C./3.3 m, and 140° C./3.3 m Example 2

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A2 (300 g), epoxy resin A4 (200 g), and curing agent B1 (500 g), followed by stirring. After visual confirmation of dissolution of the curing agent B1, cure accelerator C1 (2.5 g) was added thereto. The mixture was further stirred for 1 hour and was filtered through a nylon mesh #200 (aperture: 75 µm). The filtrate was collected as a varnish-like epoxy resin composition. A film-like epoxy resin composition having a film thickness of 250 µm and a protective film were provided on a film-like support as in Example 1 except that the varnish-like epoxy resin composition prepared above was used to prepare a sealing sheet having a configuration composed of support/film-like epoxy resin composition/protective film.

Example 3

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A2 (400 g), epoxy resin A4 (100 g), and curing agent B1 (500 g), followed by stirring. After visual confirmation of dissolution of the epoxy resin A4 and curing agent B1, cure accelerator C1 (2.5 g) was added thereto. The mixture was further stirred for 1 hour and was filtered through a nylon mesh #200 (aperture: 75 µm). The filtrate was collected as a varnish-like epoxy resin composition. A film-like epoxy resin composition having a film thickness of 250 µm and a protective film were provided on a film-like support as in Example 1 except that the varnish-like epoxy resin composition prepared above was used to prepare a sealing sheet having a configuration composed of support/film-like epoxy resin composition/protective film.

Example 4

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A2 (500 g) and curing agent B1 (500 g), followed by stirring. After visual confirmation of dissolution of the curing agent B1, cure accelerator C1 (2.5 g) was added thereto. The mixture was further stirred for 1 hour and was filtered through a nylon mesh #200 (aperture: 75 μm). The filtrate was collected as a varnish-like epoxy resin composition. A film-like epoxy resin composition having a film thickness of 250 μm and a protective film were provided on a film-like support as in Example 1 except that the varnish-like epoxy resin composition prepared above was used to prepare a sealing sheet having a configuration composed of support/film-like epoxy resin composition/protective film.

Example 5

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A2 (500 g), curing agent B2 (500 g), and curing agent B1 (400 g), followed by stirring. After visual confirmation of dissolution of the curing agent B1, cure accelerator C1 (2.5 g) was added thereto. The mixture was further stirred for 1 hour and was filtered through a nylon mesh #200 (aperture: 75 μm). The filtrate was collected as a varnish-like epoxy resin composition. A film-like epoxy resin composition having a film thickness of 250 μm and a protective film were provided on a film-like support as in Example 1 except that the varnish-like epoxy resin composition prepared above was used to prepare a sealing sheet having a configuration composed of support/film-like epoxy resin composition/protective film.

Example 6

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy' resin A2 (500 g), curing agent B2 (300 g), and curing agent B1 (200 g), followed by stirring. After visual confirmation of dissolution of the curing agent B1, cure accelerator C1 (2.5 g) was added thereto. The mixture was further stirred for 1 hour and was filtered through a nylon mesh #200 (aperture: 75 μm). The filtrate was collected as a varnish-like epoxy resin composition. A film-like epoxy resin composition having a film thickness of 250 μm and a protective film were provided on a film-like support as in Example 1 except that the varnish-like epoxy resin composition prepared above was used to prepare a sealing sheet having a configuration composed of support/film-like epoxy resin composition/protective film.

Example 7

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A3 (500 g) and curing agent B1 (500 g), followed by stirring. After visual confirmation of dissolution of the curing agent B1, cure accelerator C1 (2.5 g) was added thereto. The mixture was further stirred for 1 hour and was filtered through a nylon mesh #200 (aperture: 75 μm). The filtrate was collected as a varnish-like epoxy resin composition. A film-like epoxy resin composition having a film thickness of 250 μm and a protective film were provided on a film-like support as in Example 1 except that the varnish-like epoxy resin composition prepared above was used to prepare a sealing sheet having a configuration composed of support/film-like epoxy resin composition/protective film.

Example 8

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A4 (500 g) and curing agent B2 (500 g), followed by stirring. After visual confirmation of dissolution of the epoxy resin A4, cure accelerator C1 (2.5 g) was added thereto. The mixture was further stirred for 1 hour and was filtered through a nylon mesh #200 (aperture: 75 μm). The filtrate was collected as a varnish-like epoxy resin composition. A film-like epoxy resin composition having a film thickness of 250 μm and a protective film were provided on a film-like support as in Example 1 except that the varnish-like epoxy resin composition prepared above was used to prepare a sealing sheet having a configuration composed of support/film-like epoxy resin composition/protective film.

Example 9

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A2 (400 g), epoxy resin A4 (100 g), and curing agent B1 (500 g), followed by stirring. After visual confirmation of dissolution of the epoxy resin A4 and curing agent B1, cure accelerator C1 (2.5 g) was added thereto. The mixture was further stirred for 1 hour and was filtered through a nylon mesh #200 (aperture: 75 μm) The filtrate was collected as a varnish-like epoxy resin composition. This varnish-like epoxy resin composition was applied onto a film-like support (polyethylene terephthalate film having a thickness of 38 μm) with a coater under the following conditions to produce a film-like epoxy resin composition having a film thickness of 50 μm. A protective film (polyethylene terephthalate film having a thickness of 12 μm) was further bonded to the film-like epoxy resin composition to prepare a sealing sheet having a configuration composed of support/film-like epoxy resin composition/protective film.

Coating head system: comma
Coating and drying rate: 7 m/min
Drying conditions (temperature/furnace length): 0° C./3.3 m, 130° C./3.3 m, and 140° C./3.3 m Example 10

Organic solvent E1 (497.5 g) placed in a 10-L plastic container, and inorganic filler D1 (3500 g) was added thereto. The mixture was mixed with a stirring blade to prepare a dispersion of the inorganic filler D1. To this dispersion were added epoxy resin A2 (400 g), epoxy resin A4 (100 g), and curing agent B1 (500 g), followed by stirring. After visual confirmation of dissolution of the epoxy resin A4 and curing agent B1, cure accelerator C1 (2.5 g) was added thereto. The mixture was further stirred for 1 hour and was filtered through a nylon mesh #200 (aperture: 75 μm). The filtrate was collected as a varnish-like epoxy resin composition. This varnish-like epoxy resin composition was applied onto a film-like support (polyethylene terephthalate film having a thickness of 38 μm) with a coater under the following conditions to produce a film-like epoxy resin composition having a film thickness of 350 μm, A protective film (polyethylene terephthalate film having a thickness of 12 μm) was further bonded to the film-like epoxy resin composition to prepare a sealing sheet having a configuration composed of support/film-like epoxy resin composition/protective film.

Coating head system: comma
Coating and drying rate: 0.7 m/min
Drying conditions (temperature/furnace length): 110° C./3.3 in, 130° C./3.3 m, and 140° C./3.3 m Example 11

Organic solvent E2 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A2 (400 g), epoxy resin A4 (100 g), and curing agent B1 (500 g), followed by stirring. After visual confirmation of dissolution of the epoxy resin A4 and curing agent B1, cure accelerator C2 (2.5 g) was added thereto. The mixture was further stirred for 1 hour and was filtered through a nylon mesh #200 (aperture: 75 μm). The filtrate was collected as a varnish-like epoxy resin composition. This varnish-like epoxy resin composition was applied onto a film-like support (polyethylene terephthalate film having a thickness of 38 μm) with a coater under the following conditions to produce a film-like epoxy resin composition having a film thickness of 250 μm. A protective film (polyethylene terephthalate film having a thickness of 12 μm) was further bonded to the film-like epoxy resin composition to prepare a sealing sheet having a configuration composed of support/film-like epoxy resin composition/protective film.

Coating head system: comma.
Coating and drying rate: 1 m/min
Drying conditions (temperature/furnace length): 85° C./3.3 m, 105° C./3.3 m, and 110° C./3.3 m Example 12

Organic solvent E1 (497.5 was placed in a 10-L plastic container, and inorganic filler D1 (3400 g) and silicone powder F1 (5 g) were added thereto. The mixture was mixed with a stirring blade to prepare a dispersion of the inorganic filler D1 and silicone powder F1. To this dispersion were added epoxy resin A2 (400 g), epoxy resin A4 (100 g), and curing agent B1 (500 g), followed by stirring. After visual confirmation of dissolution of the epoxy resin A4 and curing agent B1, cure accelerator C1 (2.5 g) was added thereto. The mixture was further stirred for 1 hour and was filtered through a nylon mesh #200 (aperture: 75 μm). The filtrate was collected as a varnish-like epoxy resin composition. A film-like epoxy resin composition having a film thickness of 250 μm and a protective film were provided on a film-like support as in Example 1 except that the varnish-like epoxy resin composition prepared above was used to prepare a sealing sheet having a configuration composed of support/film-like epoxy resin composition/protective film.

Example 13

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A2 (300 g), epoxy resin A4 (200 g), and curing agent B1 (500 g), followed by stirring. After visual confirmation of dissolution of the curing agent B1, cure accelerator C1 (2.5 g) was added thereto. The mixture was further stirred for 1 hour and was filtered through a nylon mesh #200 (aperture: 75 μm). The filtrate was collected as a varnish-like epoxy resin composition. This varnish-like epoxy resin composition was applied onto a film-like support (polyethylene terephthalate film having a thickness of 38 μm) with a coater under the following conditions to produce a film-like epoxy resin composition having a film thickness of 150 μm. A protective film (polyethylene terephthalate film having a thickness of 12 μm) for protection was further bonded to the film-like epoxy resin composition to prepare a sealing sheet having a configuration composed of support/film-like epoxy resin composition/protective film.

Coating head system: comma
Coating and drying rate: 2 m/min
Drying conditions (temperature/furnace length): 110° C./3.3 m, 130° C./3.3 m, and 140° C./3.3 m Comparative Example 1

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A4 (500 g) and curing agent B1 (500 g), followed by stirring. After visual confirmation of dissolution of the epoxy resin A4 and curing agent B1, cure accelerator C1 (2.5 g) was added thereto. The mixture was further stirred for 1 hour and was filtered through a nylon mesh #200 (aperture: 75 μm). The filtrate was collected as a varnish-like epoxy resin composition. A film-like epoxy resin composition having a film thickness of 250 μm and a protective film were provided on a film-like support as in Example 1 except that the varnish-like epoxy resin composition prepared above was used to prepare a sealing sheet having a configuration composed of support/film-like epoxy resin composition/protective film.

Comparative Example 2

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A2 (200 g), epoxy resin A4 (300 g), and curing agent B1 (500 g), followed by stirring. After visual confirmation of dissolution of the epoxy resin A4 and curing agent B1, cure accelerator C1 (2.5 g) was added thereto. The mixture was further stirred for 1 hour and was filtered through a nylon mesh #200 (aperture: 75 μm). The filtrate was collected as a varnish-like epoxy resin composition. A film-like epoxy resin composition having a film thickness of 250 μm and a protective film were provided on a film-like support as in Example 1 except that the varnish-like epoxy resin composition prepared above was used to prepare a sealing sheet having a configuration composed of support/film-like epoxy resin composition/protective film.

Comparative Example 3

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A2 (200 g), epoxy resin A4 (300 g), and curing agent B1 (500 g), followed by stirring. After visual confirmation of dissolution of the epoxy resin A4 and curing agent B1, cure accelerator C1 (2.5 g) was added thereto. The mixture was further stirred for 1 hour and was filtered through a nylon mesh #200 (aperture: 75 μm). The filtrate was collected as a varnish-like epoxy resin composition. This varnish-like epoxy resin composition was applied onto a film-like support (polyethylene terephthalate film having a thickness of 38 μm) with a coater under the following conditions to produce a film-like epoxy resin composition having a film thickness of 250 μm. A protective film (polyethylene terephthalate film having a thickness of 12 μm) was further bonded to the film-like epoxy resin composition to prepare a sealing sheet having a configuration composed of support/film-like epoxy resin composition/protective film.
  Coating head system: comma
  Coating and drying rate: 0.5 m/min
  Drying conditions (temperature/furnace length): 110° C./3.3 m, 130° C./3.3 m, and 140° C./3.3 m Comparative Example 4

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A2 (300 g), epoxy resin A4 (200 g), and curing agent B1 (500 g), followed by stirring. After visual confirmation of dissolution of the curing agent B1, cure accelerator C1 (2.5 g) was added thereto. The mixture was further stirred for 1 hour and was filtered through a nylon mesh #200 (aperture: 75 μm). The filtrate was collected as a varnish-like epoxy resin composition. This varnish-like epoxy resin composition was applied onto a film-like support (polyethylene terephthalate film having a thickness of 38 μm) with a coater under the following conditions to produce a film-like epoxy resin composition having a film thickness of 100 μm. A protective film (polyethylene terephthalate film having a thickness of 12 μm) was further bonded to the film-like epoxy resin composition to prepare a sealing sheet having a configuration composed of support/film-like epoxy resin composition/protective film.
  Coating head system: comma
  Coating and drying rate: 0.5 m/min
  Drying conditions (temperature/furnace length): 110° C./3.3 m, 120° C./3.3 m, and 130° C./3.3 m Comparative Example 5

Organic solvent E1 (497.5 g) was placed in a 10-L plastic container, and inorganic filler D1 (3500 g) was added thereto. The mixture was mixed with a stirring blade to prepare a dispersion of the inorganic filler D1. To this dispersion were added epoxy resin A2 (400 g), epoxy resin A4 (100 g), and curing agent B1 (500 g), followed by stirring. After visual confirmation of dissolution of the epoxy resin A4 and curing agent B1, cure accelerator C1 (2.5 g) was added thereto. The mixture was further stirred for 1 hour and was filtered through a nylon mesh #200 (aperture: 75 μm). The filtrate was collected as a varnish-like epoxy resin composition. This varnish-like epoxy resin composition was applied onto a film-like support (polyethylene terephthalate film having a thickness of 38 μm) with a coater under the Mowing conditions to produce a film-like epoxy resin composition having a film thickness of 550 μm. A protective film (polyethylene terephthalate film having a thickness of 12 μm) for protection was further bonded to the film-like epoxy resin composition to prepare a sealing sheet having a configuration composed of support/film-like epoxy resin composition/protective film.
  Coating head system: comma
  Coating and drying rate: 0.5 m/min
  Drying conditions (temperature/furnace length): 110° C./3.3 m, 130° C./3.3 m, and 140° C./3.3 m <Method of Evaluation>

(1) Method of Measuring Viscosity of Epoxy Resin and Curing Agent

An epoxy resin or curing agent (200 mL) is put in a 250-mL wide mouth plastic bottle with a cap. The bottle is capped and placed in a thermostatic chamber at 25° C. for 60 minutes. The bottle is taken out from the thermostatic chamber, and the viscosity is measured at the following conditions. The value at one minute after the start of rotation of the rotor is defined as the viscosity of the epoxy resin or curing agent at 25° C.
  Measuring device: B-type viscometer
  Product name: VISCOMETER_BH manufactured by Toki Sangyo Co., Ltd.
  The number of rotations of the model: 20 rpm
  Rotor: selected from the following Nos. 1 to 7 depending on the viscosity:
  No. 1: <1 Pa·s
  No. 2: to 4 Pa·s
  No. 3: 4 to 10 Pa·s
  No. 4: 10 to 20 Pa·s
  No. 5: 20 to 40 Pa·s
  No. 6: 40 to 100 Pa·s
  No. 7: 100 to 400 Pa·s (2) Method of Measuring the Film Thickness of Dried Film-like Epoxy Resin Composition The film thickness of each film-like epoxy resin composition is measured by the following procedure. The protective film is peeled from the sealing sheet, and the total thickness of the support and the film-like epoxy resin composition is measured with a digital indicator (manufactured by Mitutoyo Corporation, ID-C125B, probe: flat type, stand: comparator stand BSG-20). The thickness of the film-like support is separately measured, and the value calculated by subtracting the thickness of the support from the total thickness is defined as the film thickness of the film-like epoxy resin composition.

Considering the unevenness of the thicknesses, the film thicknesses measured in Examples and Comparative Examples within the following ranges were defined as 50, 250, 350, and 550 μm, respectively.
  50 μm: 47 to 53 μm
  250 μm: 240 to 260 μm
  350 μm: 330 to 370 μm
  550 μm: 510 to 590 μm (3) Method of Calculating Amount of Volatile Portion (Ratio of Residual Solvent) of Dried Film-like Epoxy Resin Composition The amount of volatile portion (the ratio of the residual solvent) of a film-like epoxy resin composition disposed on a film-like support is calculated by the following procedure.

Samples are prepared by cutting each sealing sheet into a 5-cm square and peeling the protective film. The total weight of the sample and an aluminum cup containing the sample is measured (measurement A), where the weight of the cup is measured in advance. Subsequently, the aluminum cup containing the sample is put in an oven and is heated at 180° C. for 10 minutes and is then left to stand at room temperature for 10 minutes. Then, the weight is measured (measurement B).

Separately, the support alone is cut into a 5-cm square, and the weight thereof is measured. The weight of the support alone and the weight of the aluminum cup are subtracted from the weight measured in measurement A and from the weight measured in the measurement B to determine the weights of the film-like epoxy resin composition alone before and after the heating. The difference in the weight before and after the heating is defined as the volatilized amount (the amount of the residual solvent and the ratio of the weight of the residual solvent to the weight of the film-like epoxy resin composition alone before the heating is defined as the ratio of the residual solvent.

(4) Method of Calculating Ratio of Content of Organic Solvent (E) in One Surface of Dried, Film-like Epoxy Resin Composition to that in the Other Surface The film-like support or protective layer is peeled from a sealing sheet to expose the film-like epoxy resin composition, and both surfaces of the film-like epoxy resin composition are subjected to the measurement by a total reflection method. The content of the component (E) is calculated as the ratio of the absorption intensity at 1705 cm$^{-1}$ caused by the carbonyl (C=O) of the organic solvent (methyl isobutyl ketone) to the absorption intensity at 1610 cm$^{-1}$ caused by the benzene ring in the film-like epoxy resin composition. The ratio of the content of the component (E) in one surface to that in the other surface is calculated from the ratio of the absorption intensities.

(5) Method of Measuring Minimum Melt Viscosity of Dried Film-like Epoxy Resin Composition The minimum melt viscosity of the film-like epoxy resin composition disposed on a film-like support is measured with a rheometer by the following procedure.

The film-like epoxy resin composition (0.6 g) is peeled from the support and is molded into a tablet having a diameter of 2 cm with a compacting machine. The viscosity is measured while the temperature of this tablet being increased from 40° C. to 200° C. under the following conditions, and the lowest viscosity is defined as the minimum melt viscosity.

Measuring device: rheometer, product name: ARES-2KSTD manufactured by Rheometric Scientific, Inc.
Measurement mode: Dynamic Temperature Ramp
Frequency: 0.1 Hz
Temperature range: 40° C. to 200° C.
Rate of temperature increase: 5° C./min (6) Method of Evaluating Flexibility of Dried Film-like Epoxy Resin Composition The flexibility of the film-like epoxy resin composition disposed on a film-like support is evaluated with a bending tester (JIS type 1, Cylindrical Mandrel method) by the following procedure.

The tester used is a bending tester (JIS type 1, Cylindrical Mandrel method) manufactured by Yoshimitsu Seiki Co., Ltd. Each test piece is prepared by cutting the film-like epoxy resin composition disposed on a support into a 5-cm square. The support of the test piece is put on a cylindrical mandrel having a diameter of 2 mm, and the test piece is bent by 180°. A test piece not having cracking after the bending is evaluated as having good flexibility (indicated by "A" in the tables), and a test piece having cracking is evaluated as having poor flexibility (indicated by "B" in the tables).

(7) Method of Evaluating Releasability of Protective Film

Each sealing sheet is cut into a 5-cm square to prepare a test piece. An adhesive tape (manufactured by 3M Company, Scotch mending tape CM-12, width: 12 mm) is stuck onto this test piece. The adhesive tape is pulled to peel the protective film. A sealing sheet causing peeling between the film-like epoxy resin composition and the protective film while maintaining the smooth surface of the film-like epoxy resin composition is evaluated as having good releasability (indicated by "A" in the tables). A sealing sheet causing adhesion of the film-like epoxy resin composition to the protective film, peeling between the support and the film-like epoxy resin composition, or peeling of the adhesive tape is evaluated as having poor releasability (indicated by "B" in the tables).

(8) Method of Evaluating Swelling

Each sealing sheet is cut into a 5-cm square, and the protective film is peeled. The resulting piece is put on a 6-cm square copper clad laminate such that the film-like epoxy resin composition comes into contact with the copper clad laminate and is laminated with a vacuum pressure laminator under the following conditions.

Laminator: vacuum pressure laminator MVLP-500, manufactured by Meiki Co., Ltd.
Laminating temperature: 90° C.
Laminating pressure: 0.5 MPa
Evacuating time: 30 seconds
Laminating time: 40 seconds After the lamination, the support is peeled from the film-like epoxy resin composition, and the film-like epoxy resin composition is cured in an oven. The film-like epoxy resin compositions of Examples 1 to 10 and 12 and Comparative Examples 1 to 5 are cured under the following conditions.

Oven: SAFETY OVEN SPH-201 manufactured by Espec Corp.
(1) First Stage
Oven temperature: 110° C.
Time: 120 minutes
(2) Second Stage
Oven temperature: 160° C.
Time: 90 minutes
(3) Third Stage
Oven temperature: 180° C.
Time: 60 minutes The film-like epoxy resin composition in Example 11 is heated under the following conditions.

Oven: SAFETY OVEN SPH-201 manufactured by Espec Corp.
(1) First Stage
Oven temperature: 80° C.
Time: 120 minutes
(2) Second Stage
Oven temperature: 100° C.
Time: 90 minutes
(3) Third Stage
Oven temperature: 140° C.
Time: 60 minutes A cured film-like epoxy resin composition not having visually observed swelling is evaluated as not having swelling (indicated by "A" in the tables), and a cured film-like epoxy resin composition having visually observed swelling is evaluated as having swelling (indicated by "B" in the tables).

TABLE 1

| Item | | Example 1 | Example 2 | Example 3 | Example 4 | Example 5 | Example 6 |
|---|---|---|---|---|---|---|---|
| Epoxy resin being a liquid at 25° C. | Product/compound | A1 | A2 | A2 | A2 | A2 | A2 |
| | Amount (% by mass) | 6 | 6 | 8 | 10 | 10 | 10 |
| | Viscosity (Pa·s) | 0.1 | 2 | 2 | 2 | 2 | 2 |
| Epoxy resin not being a liquid at 25° C. | Product/compound | A4 | A4 | A4 | — | — | — |
| | Amount (% by mass) | 4 | 4 | 2 | — | — | — |
| Curing agent being a liquid at 25° C. | Product/compound | — | — | — | — | B2 | B2 |
| | Amount | — | — | — | — | 2 | 6 |
| | Viscosity (Pa·s) | — | — | — | — | 0.05 | 0.05 |
| Curing agent not being a liquid at 25° C. | Product/compound | B1 | B1 | B1 | B1 | B1 | B1 |
| | Amount (% by mass) | 10 | 10 | 10 | 10 | 8 | 4 |
| Cure accelerator | Product/compound | C1 | C1 | C1 | C1 | C1 | C1 |
| | Amount | 0.05 | 0.05 | 0.05 | 0.05 | 0.05 | 0.05 |
| Inorganic Filler | Product/compound | D1 | D1 | D1 | D1 | D1 | D1 |
| | Amount (% by mass) | 70 | 70 | 70 | 70 | 70 | 70 |
| Organic solvent | Product/compound | E1 | E1 | E1 | E1 | E1 | E1 |
| | Amount (% by mass) | 9.95 | 9.95 | 9.95 | 9.95 | 9.95 | 9.95 |
| Stress relaxation agent | Product/compound | — | — | — | — | — | — |
| | Amount (% by mass) | — | — | — | — | — | — |
| Thickness of dried film-like epoxy resin composition (μm) | | 250 | 250 | 250 | 250 | 250 | 250 |
| Ratio of residual solvent of dried film-like epoxy resin composition (% by mass) | | 1.0 | 0.9 | 0.7 | 0.6 | 0.5 | 0.4 |
| Ratio of content of organic solvent (E) in one surface of dried film-like epoxy resin composition to that in the other surface | | 0.3 to 3.1 | 0.3 to 3.0 | 0.4 to 2.8 | 0.4 to 2.7 | 0.4 to 2.7 | 0.4 to 2.6 |
| Minimum melt viscosity of dried film-like epoxy resin composition (Pa·s) | | 100 | 120 | 5 | 4 | <1 | <1 |
| Flexibility of dried film-like epoxy resin composition | | A | A | A | A | A | A |
| Releasability of protective film | | A | A | A | A | A | A |
| Presence or absence of swelling in dried film-like epoxy resin composition | | A | A | A | A | A | A |

TABLE 2

| Item | | Example 7 | Example 8 | Example 9 | Example 10 | Example 11 | Example 12 |
|---|---|---|---|---|---|---|---|
| Epoxy resin being a liquid at 25° C. | Product/compound | A3 | — | A2 | A2 | A2 | A2 |
| | Amount (% by mass) | 10 | — | 8 | 8 | 8 | 8 |
| | Viscosity (Pa·s) | 100 | — | 2 | 2 | 2 | 2 |
| Epoxy resin not being a liquid at 25° C. | Product/compound | — | A4 | A4 | A4 | A4 | A4 |
| | Amount (% by mass) | — | 10 | 2 | 2 | 2 | 2 |
| Curing agent being a liquid at 25° C. | Product/compound | — | B2 | — | — | — | — |
| | Amount | — | 10 | — | — | — | — |
| | Viscosity (Pa·s) | — | 0.05 | — | — | — | — |
| Curing agent not being a liquid at 25° C. | Product/compound | B1 | — | B1 | B1 | B1 | B1 |
| | Amount (% by mass) | 10 | — | 10 | 10 | 10 | 10 |
| Cure accelerator | Product/compound | C1 | C1 | C1 | C1 | C2 | C1 |
| | Amount | 0.05 | 0.05 | 0.05 | 0.05 | 0.05 | 0.05 |
| Inorganic Filler | Product/compound | D1 | D1 | D1 | D1 | D1 | D1 |
| | Amount (% by mass) | 70 | 70 | 70 | 70 | 70 | 70 |
| Organic solvent | Product/compound | E1 | E1 | E1 | E1 | E2 | E1 |
| | Amount (% by mass) | 9.95 | 9.95 | 9.95 | 9.95 | 9.95 | 9.95 |
| Stress relaxation agent | Product/compound | — | — | — | — | — | F1 |
| | Amount (% by mass) | — | — | — | — | — | 0.1 |
| Thickness of dried film-like epoxy resin composition (μm) | | 250 | 250 | 250 | 250 | 250 | 250 |
| Ratio of residual solvent of dried film-like epoxy resin composition (% by mass) | | 0.9 | 0.8 | 0.4 | 1.3 | 0.6 | 0.8 |
| Ratio of content of organic solvent (E) in one surface of dried film-like epoxy resin composition to that in the other surface | | 0.3 to 3.0 | 0.4 to 2.9 | 0.7 to 1.5 | 0.2 to 4.2 | 0.3 to 3.4 | 0.4 to 2.9 |
| Minimum melt viscosity of dried film-like epoxy resin composition (Pa·s) | | <1 | 10 | 60 | <1 | 4 | 12 |
| Flexibility of dried film-like epoxy resin composition | | A | A | A | A | A | A |
| Releasability of protective film | | A | A | A | A | A | A |
| Presence or absence of swelling in dried film-like epoxy resin composition | | A | A | A | A | A | A |

TABLE 3

| Item | | Example 13 | Comparative Example 1 | Comparative Example 2 | Comparative Example 3 | Comparative Example 4 | Comparative Example 5 |
|---|---|---|---|---|---|---|---|
| Epoxy resin being a liquid at 25° C. | Product/compound | A2 | — | A2 | A2 | A2 | A2 |
| | Amount (% by mass) | 6 | — | 4 | 4 | 6 | 8 |
| | Viscosity (Pa · s) | 2 | — | 2 | 2 | 2 | 2 |
| Epoxy resin not being a liquid at 25° C. | Product/compound | A4 | A4 | A4 | A4 | A4 | A4 |
| | Amount (% by mass) | 4 | 10 | 6 | 6 | 4 | 2 |
| Curing agent being a liquid at 25° C. | Product/compound | — | — | — | — | — | — |
| | Amount | — | — | — | — | — | — |
| | Viscosity (Pa · s) | — | — | — | — | — | — |
| Curing agent not being a liquid at 25° C. | Product/compound | B1 | B1 | B1 | B1 | B1 | B1 |
| | Amount (% by mass) | 10 | 10 | 10 | 10 | 10 | 10 |
| Cure accelerator | Product/compound | C1 | C1 | C1 | C1 | C1 | C1 |
| | Amount | 0.05 | 0.05 | 0.05 | 0.05 | 0.05 | 0.05 |
| Inorganic Filler | Product/compound | D1 | D1 | D1 | D1 | D1 | D1 |
| | Amount (% by mass) | 70 | 70 | 70 | 70 | 70 | 70 |
| Organic solvent | Product/compound | E1 | E1 | E1 | E1 | E1 | E1 |
| | Amount (% by mass) | 9.95 | 9.95 | 9.95 | 9.95 | 9.95 | 9.95 |
| Stress relaxation agent | Product/compound | — | — | — | — | — | — |
| | Amount (% by mass) | — | — | — | — | — | — |
| Thickness of dried film-like epoxy resin composition (μm) | | 150 | 250 | 250 | 250 | 150 | 550 |
| Ratio of residual solvent of dried film-like epoxy resin composition (% by mass) | | 0.8 | 4.5 | 4 | 2.9 | 0.3 | 4.6 |
| Ratio of content of organic solvent (E) in one surface of dried film-like epoxy resin composition to that in the other surface | | 0.3 to 3.0 | — | ≤0.1 ≥ 10.6 | ≤0.1 ≥ 10.2 | 0.6 to 1.6 | ≤0.1 ≥ 16.9 |
| Minimum melt viscosity of dried film-like epoxy resin composition (Pa · s) | | 140 | 360 | 170 | 890 | 950 | <1 |
| Flexibility of dried film-like epoxy resin composition | | A | B | B | B | B | B |
| Releasability of protective film | | A | — | A | A | A | B |
| Presence or absence of swelling in dried film-like epoxy resin composition | | A | B | B | B | A | B |

Figure 3:
FIG. 3 shows a cross section of a sample of a silicon chip having a thickness of 150 μm laminated by the film-like epoxy resin composition of Example 13.

FIG. 3 shows a cross section of a sample of a semiconductor element having a thickness of 150 μm and laminated by the film-like epoxy resin composition of Example 13. No occurrence of defective embedding can be observed. In the figure, reference sign 2a denotes the cured product of the film-like epoxy resin composition (sealing portion), reference sign 20 denotes the semiconductor element, reference sign 30 denotes the substrate, and reference sign 40 denotes the temporary fixing film.

Figure 4:
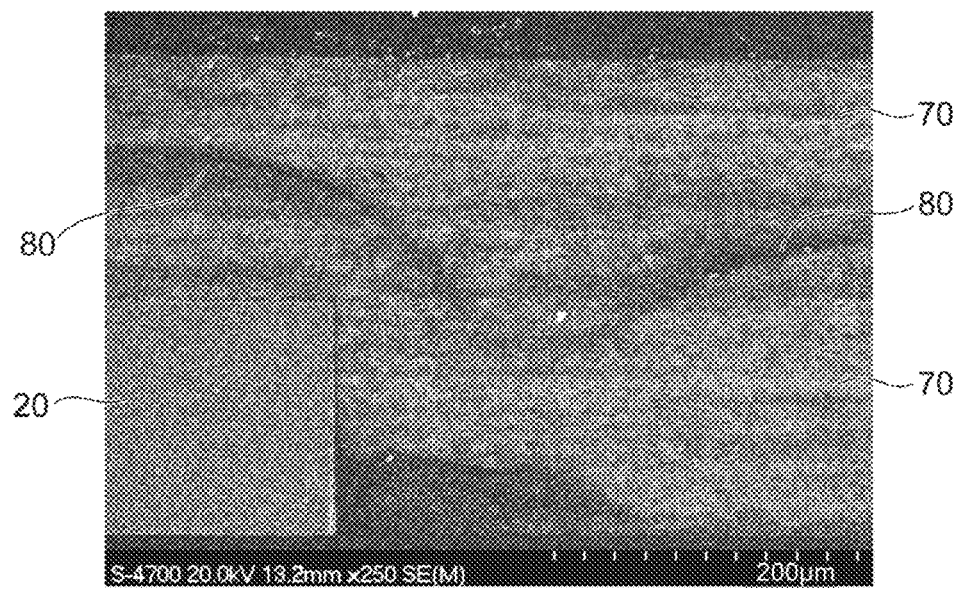
FIG. 4 is an SEM image showing a cross section of a sample of a silicon chip embedded in bonded two sheets of the film-like epoxy resin composition.
Figure 5:
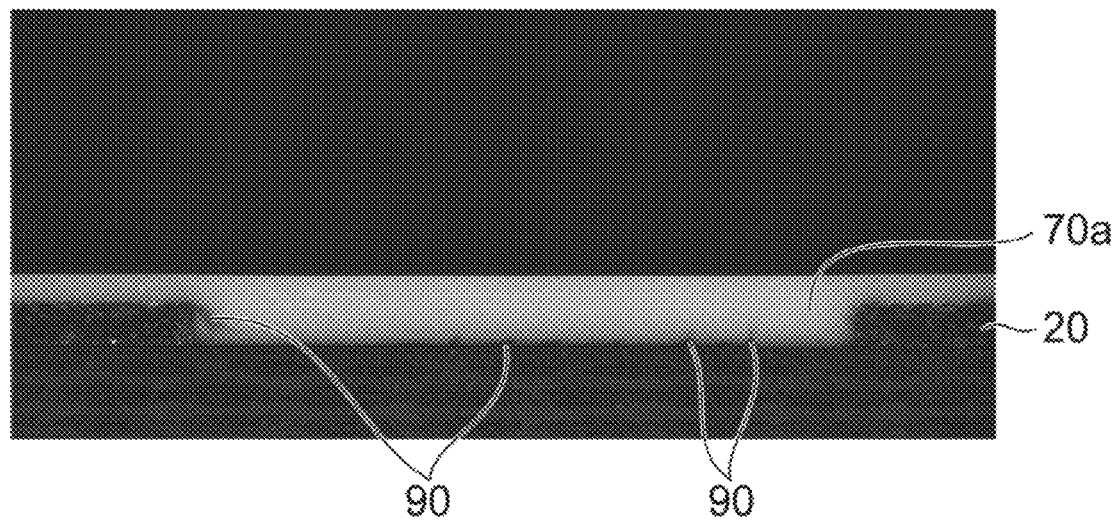
FIG. 5 shows a cross section of a sample of a silicon chip embedded in bonded two sheets of the film-like epoxy resin composition.

FIG. 4 is an SEM image showing a cross section of a sample of a silicon chip having a thickness of 150 μm embedded in two bonded sheets of the film-like epoxy resin composition of Comparative Example 4. An interface 80 between the bonded sheets of the film-like epoxy resin composition 70 can be observed. In the image, reference sign 20 denotes the silicon chip as the semiconductor element. FIG. 5 shows a cross section of a sample of a semiconductor element (silicon chip) having a thickness of 150 μm embedded in two bonded sheets of the film-like epoxy resin composition of Comparative Example 4. In the cured product (sealing portion) 70a of the film-like epoxy resin composition, voids 90 due to defective embedding are observed on the side face of a chip and near the central between the chips.

INDUSTRIAL APPLICABILITY

The present invention can provide a film-like epoxy resin composition having characteristics allowing the sealing resin to satisfactorily embed an object to be sealed, a method of producing the composition, and a sealing sheet including the composition, and to provide a method of producing a semiconductor device or an electronic component device using the composition or the method of producing it, and a semiconductor device and an electronic component device produced by the method. The film-like epoxy resin composition according to the present invention can achieve a sufficient supply of a sealing resin to an object to be sealed and a reduction in dust emission, which are challenges in formation of a large-scaled seal-molded product, and can be molded not only by molding of conventional seal molding but also by lamination or pressing not using a die.

REFERENCE SIGNS LIST

1: support, 2: film-like epoxy resin composition, 2a: cured product (sealing portion), 10: sealing sheet, 20: semiconductor element, 30: substrate, 40: temporary fixing material, 50: insulating layer, 52: insulating layer, 54: wiring, 56: ball, 60: dicing cutter, 100: seal-molded product, 200: semiconductor device

The invention claimed is:
1. A film-like epoxy resin composition comprising:
an epoxy resin (A);
a curing agent (B);
a cure accelerator (C);
an inorganic filler (D); and
an organic solvent (E), and
satisfying all the following requirements (1) to (4):
(1) at least one of the epoxy resin (A) and the curing agent (B) contains a component being a liquid at 25° C. in an amount of 30% by mass or more based on the total mass of the epoxy resin (A) and the curing agent (B);
(2) a content of a volatile portion that volatilizes by being heated at 180° C. for 10 minutes is 0.2% to 1.5% by mass based on the total amount of the epoxy resin composition;
(3) a minimum melt viscosity in temperature rising from 40° C. to 200° C. is 800 Pa·s or less; and
(4) a film thickness is 50 to 500 μm.

2. The film-like epoxy resin composition according to claim 1, wherein the film-like epoxy resin composition includes no interface that is formed by bonding two or more sheets of a film-like epoxy resin composition.

3. The film-like epoxy resin composition according to claim 1, having a ratio of the content of the organic solvent (E) in one surface of the film-like epoxy resin composition to that in the other surface of 0.2 to 5.0, where each content is calculated based on the absorption of the organic solvent (E) measured by FT-IR (total reflection method) of both surfaces of the film-like epoxy resin composition.

4. A method of producing a film-like epoxy resin composition, comprising the steps of:
    forming a coating film of a varnish-like epoxy resin composition containing an epoxy resin (A), a curing agent (B), a cure accelerator (C), an inorganic filler (D), and an organic solvent (E) and satisfying a requirement (1) on a support; and
    drying the coating film with heat to form a film-like epoxy resin composition satisfying all of requirements (2) to (4),
    requirement (1): at least one of the epoxy resin (A) and the curing agent (B) contains a component being a liquid at 25° C. in an amount of 30% by mass or more based on the total mass of the epoxy resin (A) and the curing agent (B);
    requirement (2): a content of a volatile portion that volatilizes by being heated at 180° C. for 10 minutes is 0.2% to 1.5% by mass based on the total amount of the epoxy resin composition;
    requirement (3): a minimum melt viscosity in temperature rising from 40° C. to 200° C. is 800 Pa·s or less; and
    requirement (4): a film thickness is 50 to 500 µm.

5. The method of producing a film-like epoxy resin composition according to claim 4, wherein
    the heat drying of the coating film includes heating of the coating film for a period of time of 25% or more of the total drying time at a temperature within a range of ±10° C. of the boiling point of the component (E).

6. The method of producing a film-like epoxy resin composition according to claim 4, wherein
    the coating film is dried with heat such that the ratio of the content of the organic solvent (E) in one surface of the film-like epoxy resin composition to that in the other surface is 0.2 to 5.0, where each content is calculated based on the absorption of the organic solvent (E) measured by FT-IR (total reflection method) of both surfaces of the film-like epoxy resin composition.

7. A sealing sheet comprising of:
    a film-like support; and
    the film-like epoxy resin composition according to claim 1 disposed on the support.

8. A method of producing a semiconductor device, comprising the steps of:
    pressing the film-like epoxy resin composition according to claim 1 to a semiconductor element while heating to embed the semiconductor element in the film-like epoxy resin composition; and
    curing the film-like epoxy resin composition embedding the semiconductor element.

9. A method of producing an electronic component device, comprising the steps of:
    pressing the film-like epoxy resin composition according to claim 1 to an electronic component while heating to embed the electronic component in the film-like epoxy resin composition; and
    curing the film-like epoxy resin composition embedding the electronic component.

10. A semiconductor device comprising of:
    a semiconductor element; and
    a sealing portion, embedding the semiconductor element and being made of a cured product of the film-like epoxy resin composition according to claim 1.

11. An electronic component device comprising of:
    an electronic component; and
    a sealing portion, embedding the electronic component and being made of a cured product of the film-like epoxy resin composition according to claim 1.

12. A sealing sheet comprising of:
    a film-like support; and
    a film-like epoxy resin composition prepared by the method according to claim 4 disposed on the support.

13. A method of producing a semiconductor device, comprising the steps of:
    pressing a film-like epoxy resin composition prepared by the method according to claim 4 to a semiconductor element while heating to embed the semiconductor element in the film-like epoxy resin composition; and
    curing the film-like epoxy resin composition embedding the semiconductor element.

14. A method of producing an electronic component device, comprising the steps of:
    pressing a film-like epoxy resin composition prepared by the method according to claim 4 to an electronic component while heating to embed the electronic component in the film-like epoxy resin composition; and
    curing the film-like epoxy resin composition embedding the electronic component.

15. A semiconductor device comprising of:
    a semiconductor element; and
    a sealing portion, embedding the semiconductor element and being made of a cured product of a film-like epoxy resin composition prepared by the method according to claim 4.

16. An electronic component device comprising of:
    an electronic component; and
    and a sealing portion, embedding the electronic component and being made of a cured product of a film-like epoxy resin composition prepared by the method according to claim 4.

* * * * *